United States Patent
Chen et al.

(10) Patent No.: US 10,468,361 B2
(45) Date of Patent: Nov. 5, 2019

(54) METHOD OF MANUFACTURING LIGHT EMITTING DIODES HAVING A SUPPORTING LAYER ATTACHED TO TEMPORARY ADHESIVE

(71) Applicant: MIKRO MESA TECHNOLOGY CO., LTD., Apia (WS)

(72) Inventors: Li-Yi Chen, Tainan (TW); Shih-Chyn Lin, Tainan (TW); Hsin-Wei Lee, Tainan (TW); Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 3 days.

(21) Appl. No.: 14/836,974

(22) Filed: Aug. 27, 2015

(65) Prior Publication Data

US 2017/0062650 A1    Mar. 2, 2017

(51) Int. Cl.
  *H01L 23/00* (2006.01)
  *H01L 33/60* (2010.01)
  *H01L 21/683* (2006.01)

(52) U.S. Cl.
  CPC .................. *H01L 24/00* (2013.01)

(58) Field of Classification Search
  CPC .............. H01L 33/005; H01L 33/45; H01L 2933/0025; H01L 33/79; H01L 21/7813; H01L 21/568; H01L 25/0753
  See application file for complete search history.

(56) References Cited

U.S. PATENT DOCUMENTS

| | | | | |
|---|---|---|---|---|
| 5,952,085 A | * | 9/1999 | Rickerby | C23C 14/067 384/907 |
| 8,518,204 B2 | * | 8/2013 | Hu | H01L 24/83 156/249 |
| 9,082,940 B2 | * | 7/2015 | Ebe | H01L 21/568 |
| 9,153,548 B2 | * | 10/2015 | Chan | H01L 27/156 |
| 2003/0189212 A1 | * | 10/2003 | Yoo | H01L 33/0079 257/79 |
| 2006/0128065 A1 | * | 6/2006 | Inada | C09J 7/0242 438/118 |

(Continued)

FOREIGN PATENT DOCUMENTS

| | | |
|---|---|---|
| CN | 101241964 A | 8/2008 |
| CN | 102790138 A | 11/2012 |

OTHER PUBLICATIONS

Constitutive Behaviour of Lead-Free Solders vs. Lead-containing Solders—Experiments on Bulk Specimens and Flip-Chip Joints (S. Weise, et al., Electronic Components and Technology Conference, 2001).*

(Continued)

*Primary Examiner* — Stephen M Bradley
(74) *Attorney, Agent, or Firm* — CKC & Partners Co., LLC

(57) ABSTRACT

A method for manufacturing at least one light emitting diode (LED) includes epitaxying at least one light emitting diode (LED) structure on a growth substrate; forming at least one supporting layer on the LED structure; temporarily adhering the supporting layer to a carrier substrate through an adhesive layer, in which the supporting layer has a Young's modulus greater than that of the adhesive layer; and removing the growth substrate from the LED structure.

15 Claims, 12 Drawing Sheets

(56) References Cited

U.S. PATENT DOCUMENTS

| | | | | |
|---|---|---|---|---|
| 2007/0278420 | A1* | 12/2007 | Molhave | B25J 7/00 |
| | | | | 250/442.11 |
| 2010/0317132 | A1* | 12/2010 | Rogers | H01L 25/0753 |
| | | | | 438/27 |
| 2011/0136271 | A1* | 6/2011 | von Malm | H01L 33/0079 |
| | | | | 438/15 |
| 2011/0140080 | A1* | 6/2011 | Xiong | H01L 33/0079 |
| | | | | 257/13 |
| 2012/0097983 | A1* | 4/2012 | Smith | H01L 31/055 |
| | | | | 257/84 |
| 2013/0026499 | A1* | 1/2013 | Odnoblyudov | H01L 33/486 |
| | | | | 257/88 |
| 2013/0175564 | A1* | 7/2013 | Gehrke | H01L 33/60 |
| | | | | 257/98 |
| 2014/0110738 | A1 | 4/2014 | Yokobayashi et al. | |
| 2014/0170792 | A1* | 6/2014 | Oraw | H01L 33/0079 |
| | | | | 438/34 |
| 2015/0008389 | A1* | 1/2015 | Hu | H01L 33/08 |
| | | | | 257/13 |

OTHER PUBLICATIONS

WaferBOND HT-10.10 Data Sheet, published at https://www.brewerscience.com/wp-content/uploads/2016/05/WaferBOND-HT-1010-Data-Sheet.pdf, Jan. 9, 2017.*

Engineering ToolBox, (2003). Young's Modulus—Tensile and Yield Strength for common Materials. [online] Available at: https://www.engineeringtoolbox.com/young-modulus-d_417.html [Accessed Sep. 25, 2018].*

* cited by examiner

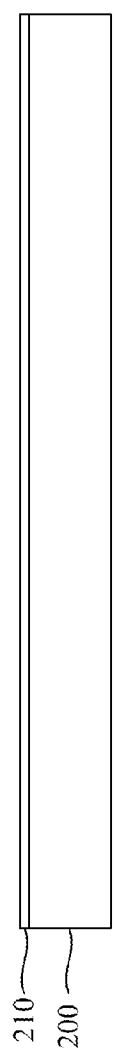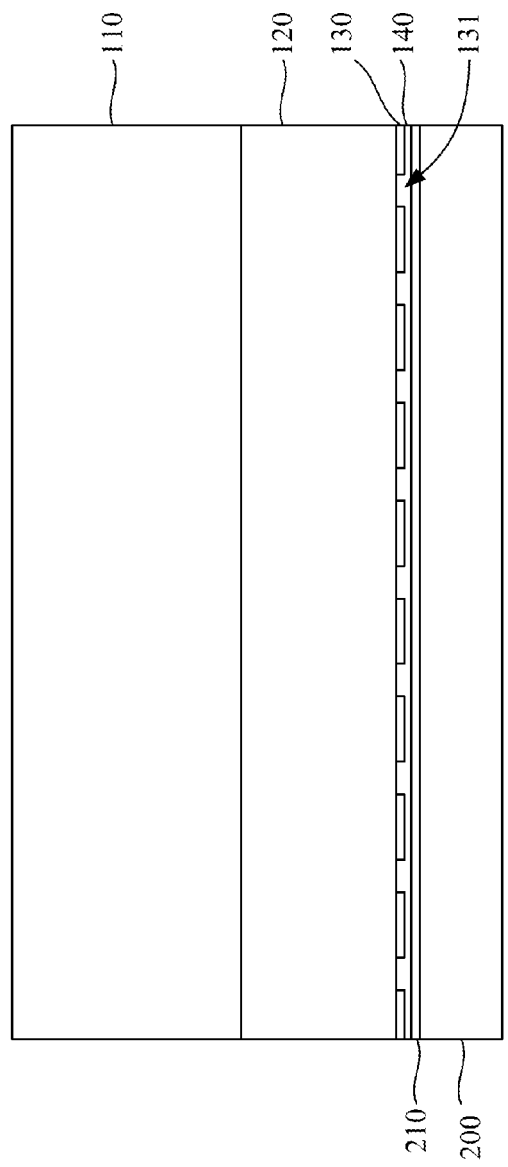

US 10,468,361 B2

METHOD OF MANUFACTURING LIGHT EMITTING DIODES HAVING A SUPPORTING LAYER ATTACHED TO TEMPORARY ADHESIVE

BACKGROUND

Field of Invention

The present invention relates to an intermediate light emitting diode and a method for manufacturing a light emitting diode.

Description of Related Art

Light emitting diodes (LEDs) have become popular in general and commercial lighting applications. As being light sources, LEDs have many advantages including low energy consumption, long lifetime, small size, and fast switching, and hence conventional illuminant technology, such as incandescent lamps, is gradually replaced by LEDs.

SUMMARY

In the fabrication process of LEDs, epitaxial layers are grown on a growth substrate. In some applications, which need to remove the growth substrate, may adopt the method of localized heating of the interface between the growth substrate and the epitaxial layers or chemical lift-off. However, the separation process sometimes suffers from the cracking of epitaxial layers.

According to one aspect of this invention, a method for manufacturing at least one light emitting diode (LED) is provided. The method includes epitaxying at least one light emitting diode (LED) structure on a growth substrate; forming at least one supporting layer on the LED structure; temporarily adhering the supporting layer to a carrier substrate through an adhesive layer, in which the supporting layer has a Young's modulus greater than that of the adhesive layer; and removing the growth substrate from the LED structure.

In one or more embodiments, the removing is performed by laser lift-off or a combination of the laser lift-off and chemical lift-off.

In one or more embodiments, the method further includes absorbing at least one vibration wave created by the removing through the supporting layer.

In one or more embodiments, the method further includes chipping at least the LED structure into a plurality of micro-LED structures.

In one or more embodiments, the chipping extends into the supporting layer, and the method further includes reducing adhesion force of the adhesive layer to the chipped supporting layer while remaining the chipped supporting layer within a controllable position on the adhesive layer; and transferring at least a part of the micro-LED structures with the chipped supporting layer from the adhesive layer to a receiving substrate after the adhesion force of the adhesive layer is reduced.

In one or more embodiments, the method further includes forming a eutectic system, a soldering contact, or a transient liquid phase sintering system of the chipped supporting layer and a bonding electrode of the receiving substrate after the micro-LED structures are transferred to the receiving substrate.

In one or more embodiments, the LED structure includes a current controlling structure joined with one of the first type semiconductor layer and the second type semiconductor layer, the current controlling structure having at least one opening therein.

According to another aspect of this invention, an intermediate LED includes a carrier substrate, at least one LED structure, a supporting layer, and an adhesive layer. The supporting layer is disposed between the LED structure and the carrier substrate. The adhesive layer temporarily adheres a combination of the supporting layer and the LED structure to the carrier substrate, in which the supporting layer has a Young's modulus greater than that of the adhesive layer.

BRIEF DESCRIPTION OF THE DRAWINGS

FIG. 2E is a cross-sectional side view illustration of a carrier substrate with an adhesive layer according to an embodiment of the invention;

FIG. 2F is a cross-sectional side view illustration of bonding the structure of FIG. 2D and the structure of FIG. 2E together according to an embodiment of the invention;

DETAILED DESCRIPTION

Figure 1:
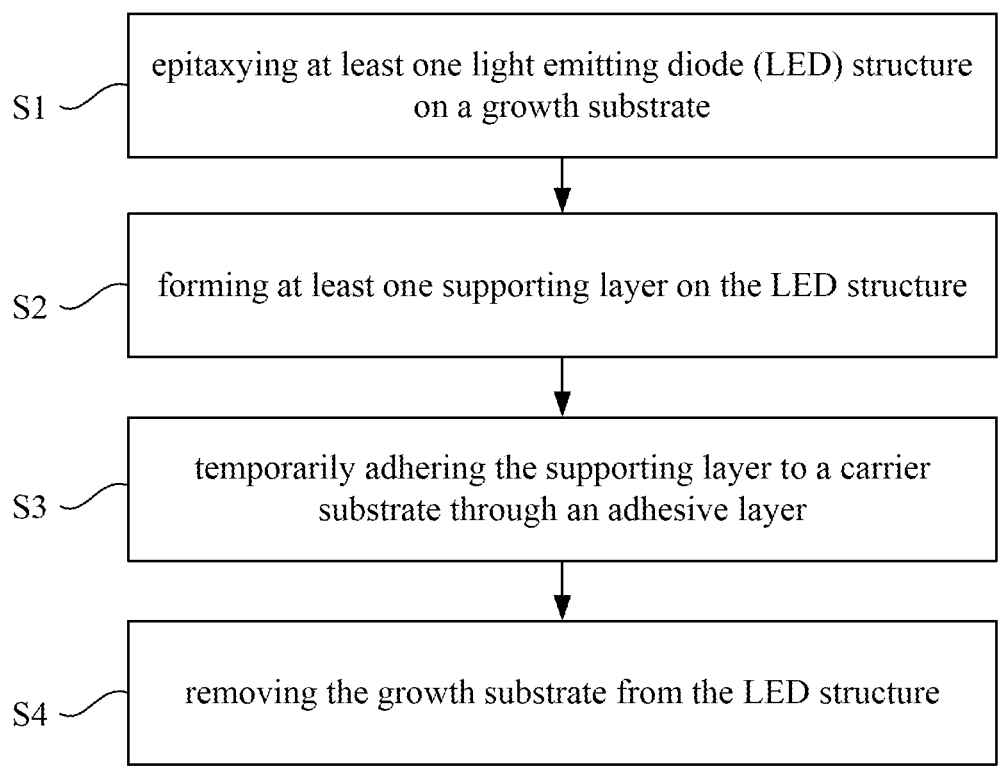
FIG. 1 is a flow chart of a method for manufacturing a light emitting diode (LED) according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present invention describe micro semiconductor devices such as micro-light-emitting diodes (micro-LEDs) and a method of removing a growth substrate of a semiconductor wafer and forming an array of micro semiconductor devices for transfer to a receiving substrate. For example, the receiving substrate may be, but is not limited to, a display substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures according to embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales.

Some embodiments of the invention describe a method of processing a bulk LED substrate into an array of micro-LEDs which are poised for pick up and transfer to a receiving substrate. In this manner, it is possible to integrate and assemble micro-LEDs into heterogeneously integrated systems. The micro-LEDs can be picked up and transferred individually, in groups, or as the entire array. Thus, the micro-LEDs in the array of micro-LEDs are poised for pick up and transfer to a receiving substrate such as display substrate of any size ranging from micro displays to large area displays, and at high transfer rates. In some embodiments, arrays of micro-LEDs which are poised for transfer are described as having a fine pitch and each micro-LED has a regular octagon shape with the pitch size of 10 um. Thus a 4-inch LED epi wafer could be divided into a micro-LED array which contains more than 27 million devices. Thus, a high density of pre-fabricated micro devices with a specific functionality may be produced in a manner in which they are poised for pick up and transfer to a receiving substrate.

FIG. 1 is a flow chart of a method for manufacturing at least one light emitting diode (LED) according to an embodiment of the invention. The method includes at least steps S1-S4. The light emitting diode can be manufactured by steps S1-S4 according to operations sequentially illustrated by FIGS. 2A and 2C-2K.

Figure 2A:
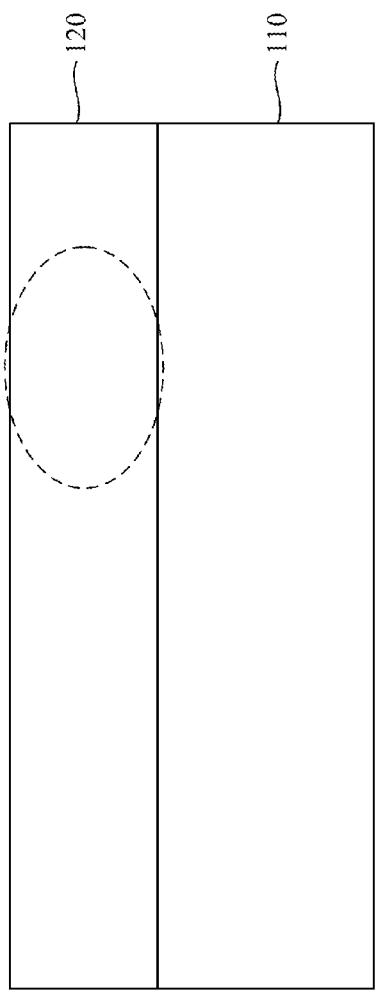
FIG. 2A is a cross-sectional side view illustration of a bulk LED substrate according to an embodiment of the invention.

FIG. 2A is a cross-sectional side view illustration of a bulk LED substrate according to an embodiment of the invention. Reference is made both to FIG. 2A and FIG. 1. At step S1 of FIG. 1, at least one LED structure 120 is formed on a growth substrate 110. To be specific, the LED structure 120 can be semiconductor device layers epitaxied on the growth substrate 110. In an embodiment, the LED structure 120 may not be fully functional. For example, contacts such as an anode or cathode may not yet be formed. In the interest of conciseness and to not obscure embodiments of the invention, the following description is made with regard to the LED structure 120 as a p-n diode layer grown on the growth substrate 110 according to conventional heterogeneous growth conditions.

The LED structure 120 may include a compound semiconductor having a bandgap corresponding to a specific region in the spectrum. For example, the LED structure 120 may include one or more layers based on II-VI materials (e.g. ZnSe, ZnO) or III-V nitride materials (e.g. GaN, AlN, InN, InGaN, GaP, AlInGaP, AlGaAs and their alloys). The growth substrate 110 may include any suitable substrate such as, but not limited to, silicon, SiC, GaAs, GaN and sapphire ($Al_2O_3$).

In a particular embodiment, the growth substrate 110 is sapphire, and the LED structure 120 is formed of GaN. Despite the fact that sapphire has a larger lattice constant and thermal expansion coefficient mismatch with respect to GaN, sapphire is reasonably low cost, widely available and its transparency is compatible with laser lift-off (LLO) techniques. In another embodiment, another material such as SiC may be used as the growth substrate 110 for the GaN LED structure 120. Like sapphire, SiC substrates may be transparent. Several growth techniques may be used for growth of the LED structure 120 such as metalorganic chemical vapor deposition (MOCVD).

Figure 2B:
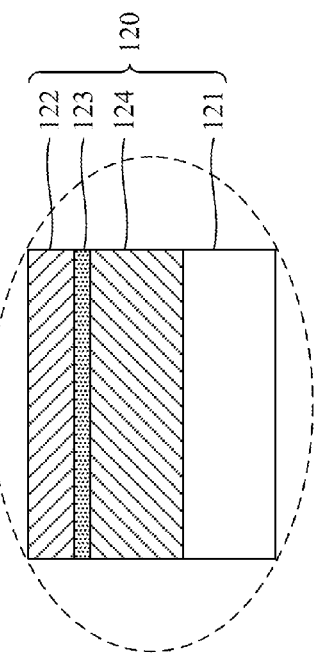
FIG. 2B is an enlarged section of the LED structure in FIG. 2A.

FIG. 2B is an enlarged section of the LED structure 120 in FIG. 2A. In the particular embodiment illustrated in FIG. 2B, the LED structure 120 may include a first type semiconductor layer 122 (e.g., a p-doped layer), an active layer 123, a second type semiconductor layer 124 (e.g., an n-doped layer), and a buffer bulk GaN layer 121. In some embodiments, the buffer bulk GaN layer 121 is optionally not formed in the LED structure 120, so the following operation of removing the buffer bulk GaN layer 121 (i.e., the operation illustrated in FIG. 2H can be omitted. The buffer bulk GaN layer 121 may be undoped GaN n-doped due to silicon or oxygen contamination, or intentionally doped with a donor such as silicon. The second type semiconductor layer 124 may likewise be doped with a donor such as silicon, while the first type semiconductor layer 122 may be doped with an acceptor such as magnesium. A variety of alternative p-n diode configurations may be utilized to form the LED structure 120. Likewise, a simple p-n contact junction or a variety of single quantum well (SQW) or multiple quantum well (MQW) configurations may be utilized to form the active layer 123. In addition, various buffer layers may be included as appropriate. In one embodiment, the sapphire growth substrate 110 has a thickness of approximately 100 μm-400 μm, the buffer bulk GaN layer 121 has a thickness of approximately 3 μm-5 μm, the second type semiconductor layer 124 has a thickness of approximately 0.1 μm-5 μm, the active layer 123 has a thickness less than approximately 100-400 nm, and the first type semiconductor layer 122 has a thickness of approximately 100 nm-1 μm.

Figure 2C:
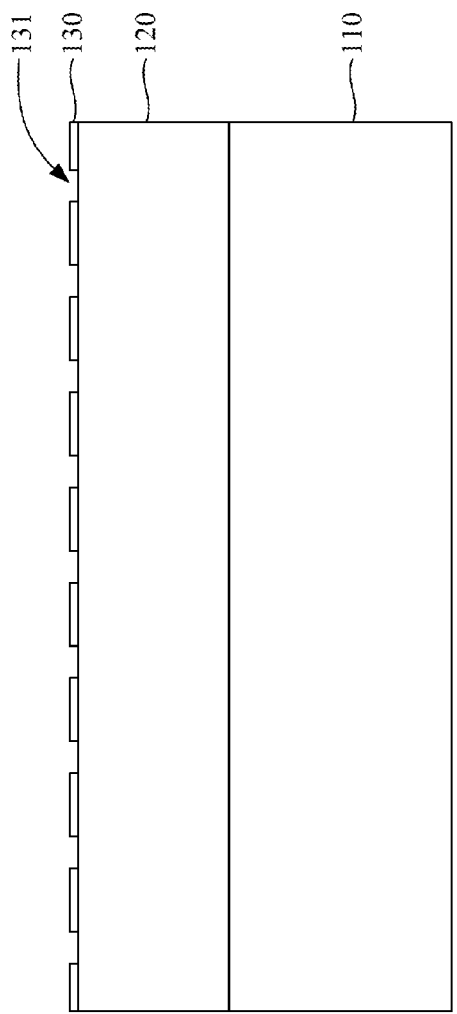
FIG. 2C is a cross-sectional side view illustration of a patterned current controlling structure formed on the LED structure in FIG. 2A according to an embodiment of the invention.

FIG. 2C is a cross-sectional side view illustration of a patterned current controlling structure 130 formed on the LED structure 120 in FIG. 2A according to an embodiment of the invention. Referring now to FIG. 2C, at least one current controlling structure 130 may then be formed over the LED structure 120, and patterned to form a plurality of openings 131 to expose the LED structure 120.

In the embodiment of the invention, after a plurality of the micro-LEDs are manufactured (as described in the following description), each of micro-LEDs includes a current controlling structure 130 joined with one of the first type semiconductor layer 122 and the second type semiconductor layer 124 (shown in FIG. 2B), the current controlling structure 130 having one opening 131 therein, but the invention is not limited in this regard. In some embodiments, after a plurality of the micro-LEDs are manufactured, each of the micro-LEDs may have more than one opening 131. In some embodiments, the formation of the current controlling structure 130 is not necessary and can be omitted, and that is, the micro-LEDs may have no current controlling structure 130.

Figure 2D:
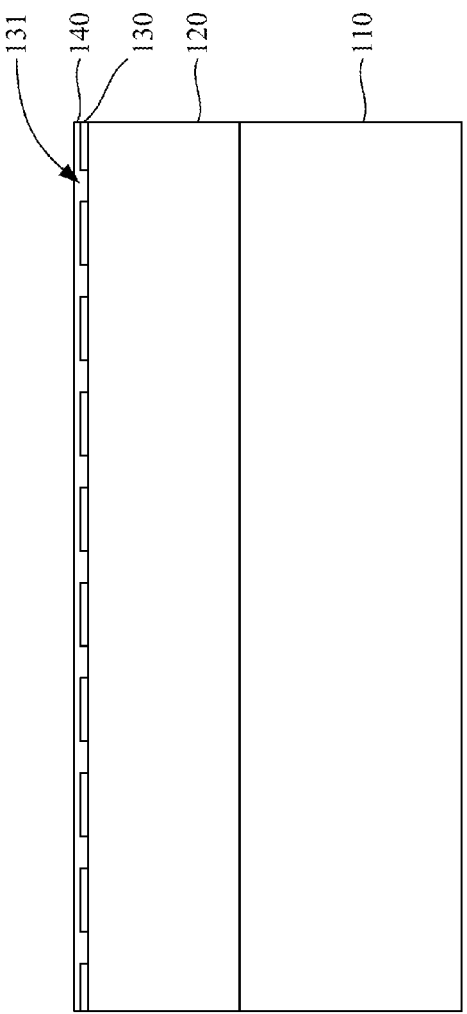
FIG. 2D is a cross-sectional side view illustration of a supporting layer formed on the patterned current controlling structure in FIG. 2C according to an embodiment of the invention.

FIG. 2D is a cross-sectional side view illustration of at least one supporting layer 140 formed on the patterned current controlling structure 130 in FIG. 2C according to an embodiment of the invention. Reference is made both to FIG. 1 and FIG. 2D. At step S2 of FIG. 1, a supporting layer 140 is formed on the LED structure 120. The supporting layer 140 is electrically coupled with the exposed parts of the first type semiconductor layer 122 of the LED structure 120 through the openings 131. The supporting layer 140 serves as an electrode layer, though other layers may be included. In an embodiment, the supporting layer 140 has a thickness greater than or equal to about 2 μm. The supporting layer 140 can be made of metal, alloy, or a transparent conductive material. For example, the supporting layer 140 can be made of titanium, tungsten, nickel, gold, platinum, palladium, rhodium, molybdenum, aluminum, copper, or any combinations thereof. In some embodiments, the supporting layer 140 may also be reflective. In some embodiments, a plurality of the supporting layers are stacked together, and the supporting layers may be made of the same or different materials.

FIG. 2E is a cross-sectional side view illustration of a carrier substrate 200 with an adhesive layer 210 according to an embodiment of the invention. FIG. 2F is a cross-sectional side view illustration of bonding the structure of FIG. 2D and the structure of FIG. 2E together according to an embodiment of the invention. Reference is made both to FIG. 1 and FIG. 2F. At step S3 of FIG. 1, a combination of the LED structure 120, the current controlling structure 130, and the supporting layer 140 grown on the growth substrate 110 is subsequently transferred to the carrier substrate 200 before chipped, and the supporting layer 140 is temporarily adhered to the carrier substrate 200 through the adhesive layer 210. In some embodiments, the supporting layer 140 and the LED structure 120 may be chipped prior to transfer to a carrier substrate 200. Accordingly, embodiments of the invention may be implemented in a multitude of variations during formation of an array of micro-LEDs 100A for subsequent transfer to the receiving substrate 300.

In an embodiment, the adhesive layer 210 may have a thickness of approximately 0.1 μm-100 μm. In some embodiments, the adhesive layer 210 may have a thickness greater than or equal to about few micrometers.

The adhesive layer 210 may be made of adhesion capable organic or non-organic materials, e.g., UV curable glue, epoxy, polymethylmethacrylate (PMMA), polysiloxanes, silicone, or any combinations thereof. The adhesive layer 210 may be formed from a material which is capable of adhering the combination of the LED structure 120, the current controlling structure 130, and the supporting layer 140 to the carrier substrate 200. Specifically, the adhesion force of the adhesive layer 210 could be adjusted or reduced by an electric field, UV light, electromagnetic radiation, heat, ultrasound, mechanical force, pressure, chip lifting, or any combinations thereof. Referring now to FIG. 2F, the combination of the LED structure 120, the current controlling structure 130, and the supporting layer 140 and the carrier substrate 200 may be bonded together by using the adhesive layer 210.

Figure 2G:
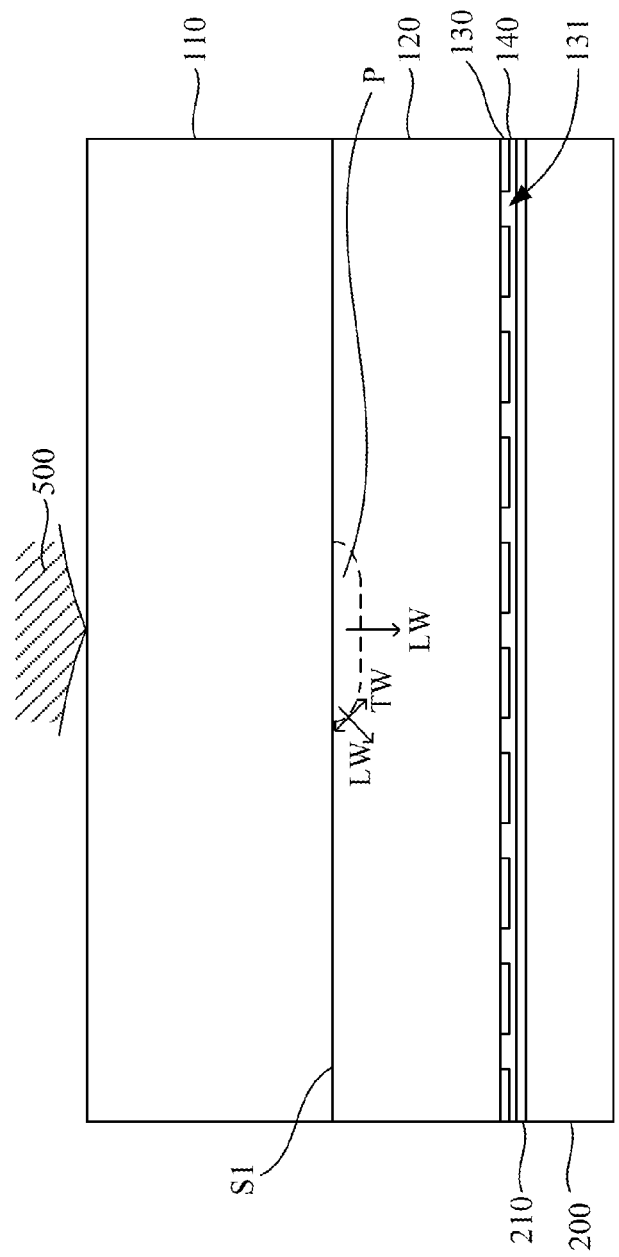
FIG. 2G is a cross-sectional side view illustration of the bonded structure in FIG. 2F processed by a removing process according to an embodiment of the invention.

FIG. 2G is a cross-sectional side view illustration of the bonded structure in FIG. 2F processed by a removing process according to an embodiment of the invention. Reference is made both to FIG. 1 and FIG. 2G. At step S4 of FIG. 1, the growth substrate 110 is removed from the LED structure 120 by a suitable removing process such as laser lift-off (LLO), a combination of the laser lift-off and chemical lift-off, or a combination of the laser lift-off and mechanical lift-off. While using LLO, the absorption in the GaN LED structure 120 at the interface S1 results in localized heating of the interface resulting in decomposition at the interfacial GaN into Ga metal and nitrogen gas. Once the desired area has been irradiated, the transparent sapphire growth substrate 110 can be removed easily.

In detail, after being shot by a laser pulse 500, a portion of the LED structure 120 ionizes rapidly to form a plasma P with high temperature and high pressure. The sudden expansion of the formed plasma P generates a vibration wave propagating into the LED structure 120. The vibration wave expands spherically in both perpendicular and lateral direction at similar velocities. At the center of the illuminated area, a wave front of the vibration wave can be a plane, and a longitudinal wave LW dominates and results in a lateral cracking that may be desirable to increase the separation at the interface S1 of the growth substrate 110 and the LED structure 120. However, in the surrounding of the illuminated area, the wave front of the vibration wave may be spherical, a transverse wave TW is generated and cooperates with the longitudinal wave LW, thereby causing damage and cracking in the LED structure 120.

In other words, the removing process performed by LLO or the combination of the laser lift-off and chemical lift-off may generate a longitudinal wave LW and a transverse wave TW at the interface S1 of the growth substrate 110 and the LED structure 120. The transverse wave TW includes oscillations occurring substantially perpendicular to a direction of energy transfer of the removing, and may substantially result in damage and cracking in the LED structure 120.

Traditionally, the vibration wave generated by LLO tends to be reflected back to propagate in the LED structure 120 by the adhesive layer 210, which is soft. In one or more embodiments, the supporting layer 140 serves as an absorber that absorbs and reduces the vibration wave (especially the transverse wave TW) propagating in the LED structure 120, and thereby preventing the LED structure 120 from damage and cracking. In one or more embodiments of the present invention, the supporting layer 140 is made of rigid material. The supporting layer 140 is designed to have a Young's modulus greater than that of the adhesive layer 210. The supporting layer 140 is capable of helping absorbing the vibration wave and reducing the transverse wave TW from being reflected back to propagate in the LED structure 120. The supporting layer 140 also can contribute to the mechanical strength to the LED structure. Therefore, the LED structure 120 is prevented from cracking. As the previous description, the supporting layer 140 may have a thickness greater than or equal to about 2 μm, so as to absorb the vibration wave.

In some embodiment, the ablation depth of the laser pulse 500 is approximately 20 nm from the interface S1 of the growth substrate 110 and the LED structure 120. It should be noted that the relative scale of the plasma P, the laser pulse 500, and the current controlling structure 130 in FIG. 2G should not limit the scope of the present invention. The spot size of the laser pulse 500 or a projection of the plasma P on the interface S1 can be smaller or larger than a projection of the current controlling structure 130 on the interface S1.

Herein, LLO is used as an exemplary removing method, but it should not limit the scope of the present invention. Other various removing processes may be applied in the embodiments of present invention.

Figure 2H:
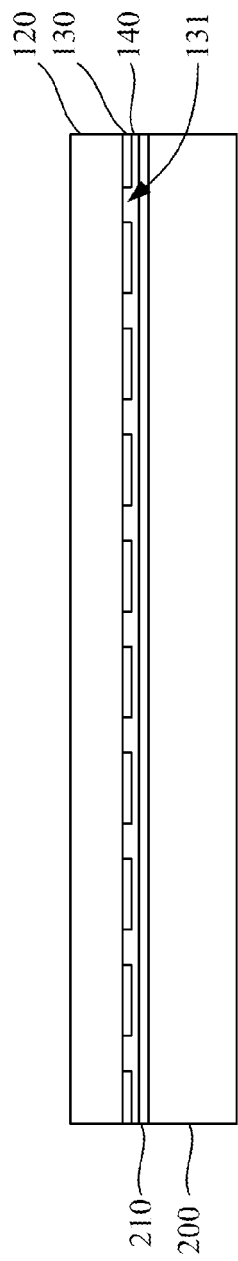
FIG. 2H is a cross-sectional side view illustration of the bonded structure in FIG. 2F with the grow substrate removed and the LED structure thinned according to an embodiment of the invention.

FIG. 2H is a cross-sectional side view illustration of the bonded structure in FIG. 2F with the grow substrate removed and the LED structure 120 thinned according to an embodiment of the invention. Reference is made to FIG. 2H. After the growth substrate 110 (referring to FIG. 2G) is removed from the LED structure 120, the LED structure 120 is then thinned down to a desirable thickness. Reference is made both to FIG. 2H and FIG. 2B. To thin the LED structure 120, a predetermined amount of the buffer bulk GaN layer 121 (which may be n-type) or a portion of the second type semiconductor layer 124 is removed so that an operable LED structure remains after thinning. The buffer bulk GaN layer 121 can be fully etched. Alternatively, the buffer bulk GaN layer 121 can be partially etched to form contact holes via which the second type semiconductor layer 124 can be electrically coupled with an electrode formed on the LED structure 120. In some embodiments, the buffer bulk GaN layer 121 is optionally not formed in the LED structure 120, so the operation of removing the buffer bulk GaN layer 121 can be omitted. Depending upon the underlying structure, the thinning process may be optionally performed utilizing suitable techniques such as dry etching to etch the buffer bulk GaN layer 121.

Figure 2I:
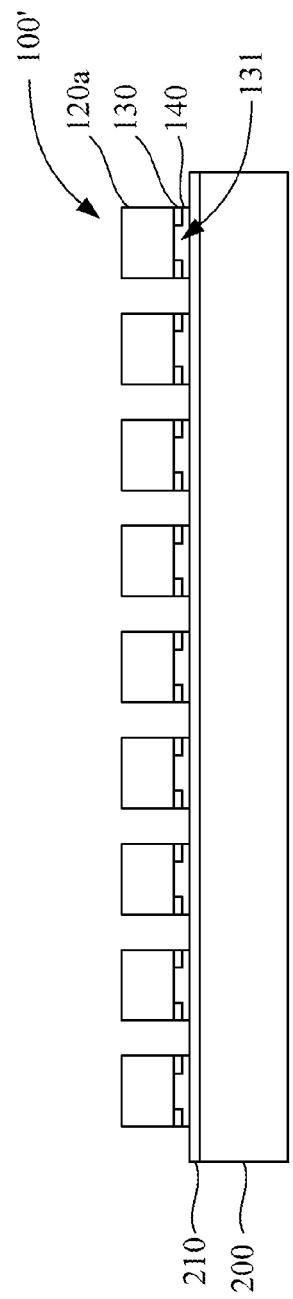
FIG. 2I is a cross-sectional side view illustration of etching the LED structure and the supporting layer in FIG. 2H to form micro LED structures according to an embodiment of the invention.

FIG. 2I is a cross-sectional side view illustration of etching the LED structure 120 and the supporting layer 140 in FIG. 2H to form micro LED structures 120a according to an embodiment of the invention. Referring now to FIG. 2I, after removing the growth substrate 110 (FIG. 2G), the LED structure 120 is chipped into a plurality of micro-LED structures 120a. The chipping extends into the supporting layer 140. The plurality of micro LED structures 120a with the current controlling structure 130 and the chipped supporting layer 140 are positioned over the adhesive layer 210. In the embodiment, the micro LED structures 120a have vertical sidewalls. For example, ICP (Inductively Coupled Plasma) which a chlorine-based etch chemistry may be utilized to obtain vertical sidewalls.

In this embodiment, the chipping is performed after the removing of the growth substrate 110 (FIG. 2G), but it should not limit the scope of present invention. In some embodiments, a combination of the LED structure 120, current controlling structure 130, and the supporting layer 140 is chipped first, and the growth substrate 110 may then be removed.

Herein, the carrier substrate 200 is provided having an array of micro-LEDs 100' disposed thereon. Each micro-LED 100' may at least include the micro LED structure 120a, the current controlling structure 130 having at least one opening 131, and the supporting layer 140, with the supporting layer 140 between the current controlling structure 130 and the adhesive layer 210 on the carrier substrate 200.

From a different point of view, an intermediate micro-LED including a carrier substrate 200, at least one LED structure 120a, a supporting layer 140, and an adhesive layer 210 is shown in FIG. 2I. The supporting layer 140 is disposed between the LED structure 120a and the carrier substrate 200. The adhesive layer 210 temporarily adheres a combination of the supporting layer 140 and the LED structure 120a to the carrier substrate 200, in which the supporting layer 140 has a Young's modulus greater than that of the adhesive layer 210.

Figure 2J:
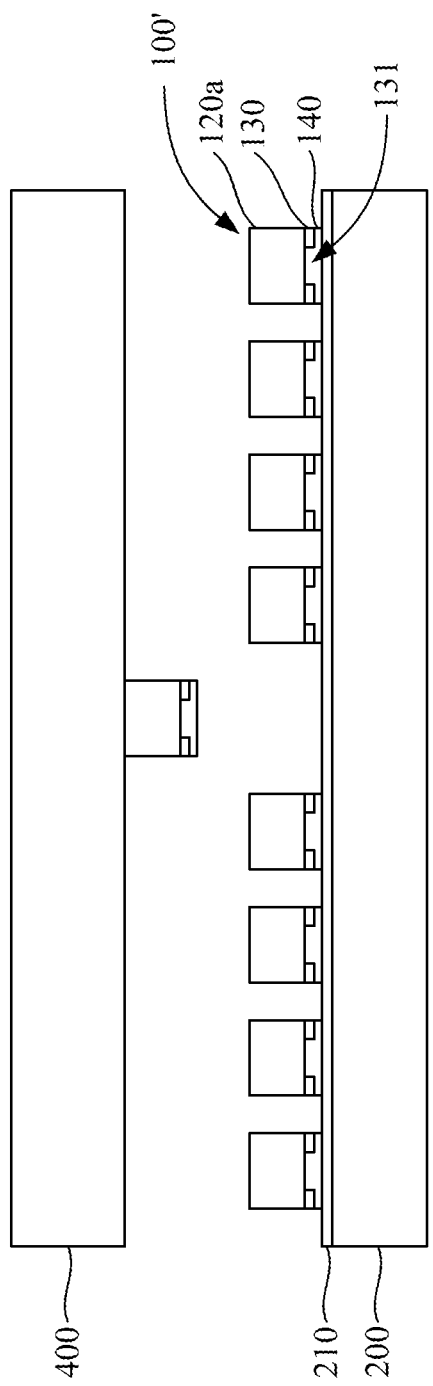
FIG. 2J is a cross-sectional side view illustration of a transfer head picking up a micro-LED from the carrier substrate in FIG. 2I according to an embodiment of the invention.

FIG. 2J is a cross-sectional side view illustration of a transfer head 400 picking up a micro-LED 100' from the carrier substrate 200 in FIG. 2I according to an embodiment of the invention. Referring now to FIG. 2J, the micro-LEDs 100' or array of micro-LEDs 100' in FIG. 2J are poised for pick up and transfer to the receiving substrate 300 illustrated in FIG. 2K, for example with a transfer head 400.

In some embodiments, the Young's modulus of the adhesive layer 210 is less than or equal to 30 GPa. As a result, the adhesive layer 210 may absorb mechanical impact forces associated with contacting the micro-LEDs 100' with a transfer head 400 during the pick up process.

Figure 2K:
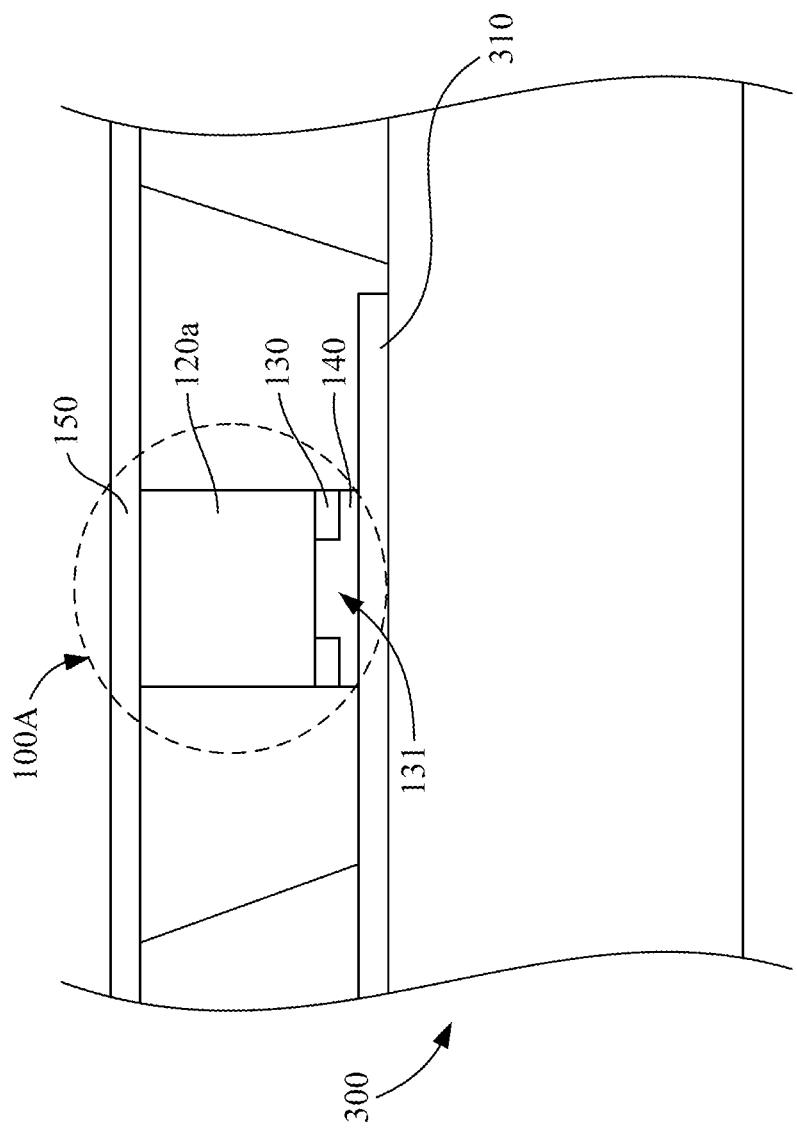
FIG. 2K is a cross-sectional view of a micro-LED disposed on a receiving substrate according to an embodiment of this invention.

To transfer the micro-LED 100' to the receiving substrate 300 illustrated in FIG. 2K, the adhesion force of the adhesive layer 210 is decreased by an electric field, UV light, electromagnetic radiation, heat, ultrasound, mechanical force, pressure, chip lifting, or any combinations thereof in advance. In this embodiment, the adhesion force of the adhesive layer 210 to the chipped supporting layer 140 is reduced while the chipped supporting layer 140 within a controllable position on the adhesive layer 210.

A variety of suitable transfer heads can be utilized to aid in the pick up and placement operations according to embodiments of the invention. For example, the transfer head 400 may exert a pick up pressure on the micro-LED 100' according to vacuum, magnetic, adhesion, or electrostatic attraction in order to pick up the micro-LED 100'.

FIG. 2K is a cross-sectional view of a micro-LED 100A disposed on a receiving substrate 300 according to an embodiment of this invention. Referring to FIG. 2K, which is an illustration of the receiving substrate 300 onto which a micro-LED 100A has been placed. In the embodiment, at least a part of the micro-LED structures 120a with the current controlling structure 130 and the chipped supporting layer 140 are transferred from the adhesive layer 210 (FIG. 2J) to a receiving substrate 300 after the adhesion force of the adhesive layer 210 is reduced. In the embodiment, the receiving substrate 300 is a display substrate. In the particular embodiment illustrated, the micro-LED 100' shown in FIG. 2J may be placed over the bonding electrode 310 of the receiving substrate 300. Then, a second conductive layer 150 may then be formed over the micro LED structure 120a, so as to form the micro-LED 100A shown in FIG. 2K. In some embodiments, the second conductive layer 150 is formed from a transparent contact material such as indium tin oxide (ITO). In some embodiments, the second conductive layer 150 is in the form of a bonding wire.

In one ore more embodiments, the bonding electrode 310 of the receiving substrate 300 and the chipped supporting layer 140 may form a adhesive bonding system, such as a eutectic system, a soldering contact, or a transient liquid phase sintering (TLPS) system, after the micro-LED structures 120a are transferred to the receiving substrate 300. The adhesive bonding system is established at a temperature below the melting points of the bonding electrode 310 and the supporting layer 140. The materials and compositions of the supporting layer 140 and the bonding electrode 310 are chosen adequately to establish the adhesive bonding system, and the material of the supporting layer 140 is further chosen to have a Young's modulus greater than that of the adhesive layer.

For example, the supporting layer 140 can but not be limited be made of gold, indium, nickel, titanium, molybdenum, tin, silver, bismuth, lead, gallium, cadmium or any combinations or alloys thereof. Some portion of the bonding electrode 310 can be the similar matters as the material of the supporting layer 140. On the other hand, the material of the bonding electrode 310 can be different from the material of the supporting layer 140 but still has the ability to form the adhesive bonding system with the supporting layer 140.

To be specific, for the eutectic system, in some embodiments, the supporting layer 140 and the bonding electrode 310 can be made of a mixture of indium and gold or a mixture of indium and silver with a determined ratio. For the soldering contact, the supporting layer 140 and the bonding electrode 310 can both made of solder. For the TLPS system, the bonding electrode 310 and the supporting layer 140 can be made of metal and solder respectively, such as silver and bismuth-tin alloy with a determined ratio, and the supporting layer 140 and the bonding electrode 310 can bond and permeate together. As is known in the art, the bonding electrode 310 and the supporting layer 140 can be made of various materials, and the detail illustration is omitted herein.

In one embodiment, the LED structure 120a may include a second type semiconductor layer 124 with a thickness of approximately 0.1 μm-50 μm, the active layer 123 (which may be SQW or MQW) with a thickness approximately 50 nm-5 μm, and the first type semiconductor layer 122 with thickness of approximately 50 nm-20 μm. In an embodiment, the second type semiconductor layer 124 may be 0.1 μm-6 μm thick (which may include or replace bulk layer 121 previously described).

In some embodiments, the current controlling structure 130 is a dielectric layer which is made of a dielectric material, such as silicon nitride or silicon dioxide. The thickness of the current controlling structure 130 is in a range from 1 nm to 5 μm. The current controlling structure 130 is formed by, for example, physical vapor deposition (PVD), or CVD. However, it should not limit the scope of the present disclosure, and in some embodiments, the current controlling structure 130 is capable of adjust the current distribution in the LED structure 120a, and can be a semiconductor layer, a high resistivity layer, an electron blocking layer, or a hole blocking layer. In some embodiments, the material of the current controlling structure 130 may be homogeneous with the semiconductor layer that the current controlling structure 130 joined with, or in some embodiments, the material of the current controlling structure 130 may be heterogeneous to the semiconductor layer that the current controlling structure 130 joined with.

Referring back to FIG. 2K, in the embodiment, the current controlling structure 130 is located at a side of the micro LED structures 120a proximal to the bonding electrode 310 of the receiving substrate 300. That is, the opening 131 of the current controlling structure 130 faces toward the receiving substrate 300. However, the invention is not limited in this regard.

In some embodiments, instead of being located between the micro LED structures 120a and the supporting layer 140, the current controlling structure 130 may be located between the micro LED structures 120a and the second conductive layer 150. Furthermore, in some embodiments, two current controlling structures 130 may be respectively located at two opposite side of the micro LED structures 120a, in which the two opposite sides of the micro LED structures 120a are respectively proximal and distal to the bonding electrode 310. The configuration of the current controlling structure 130 is only briefly described herein, but it should not limit the scope of the present disclosure. Various modifications and changes can be implemented in the configuration of the current controlling structure 130.

Figure 3:
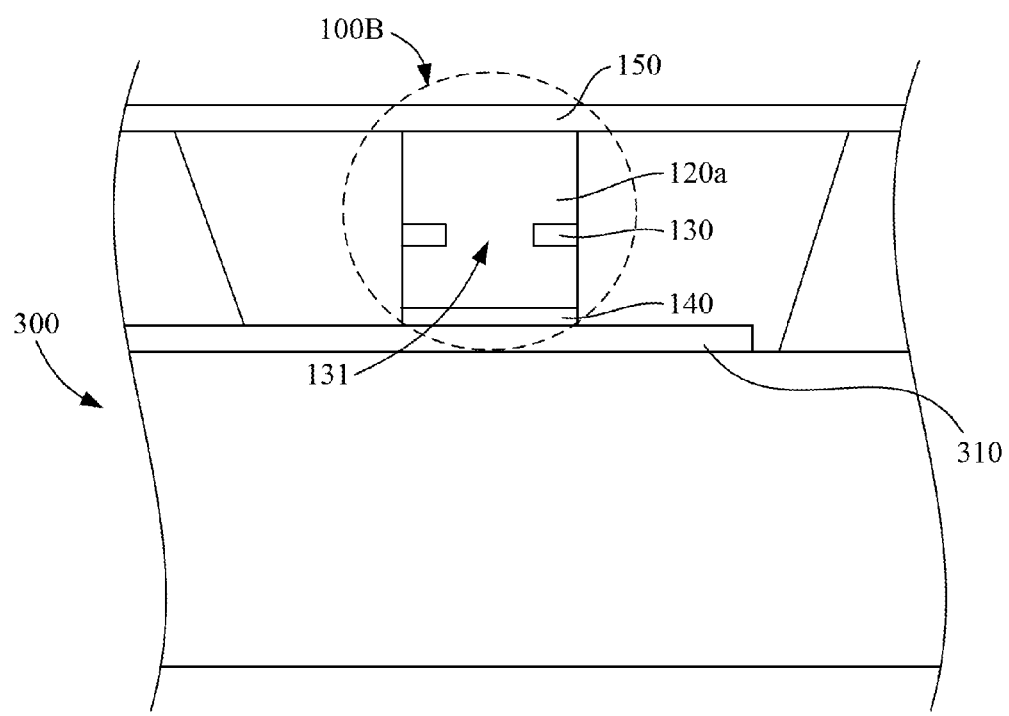
FIG. 3 is a cross-sectional view of a micro-LED disposed on a receiving substrate according to an embodiment of this invention.

FIG. 3 is a cross-sectional view of a micro-LED 100B disposed on a receiving substrate 300 according to an embodiment of this invention. The micro-LED 100B includes a micro LED structure 120a, a current controlling structure 130 disposed in the micro LED structure 120a, a supporting layer 140, and a second conductive layer 150. It is noted that the difference between the current controlling structure 130 of FIG. 3 and the current controlling structure 130 of FIG. 2K is that the current controlling structure 130 of FIG. 3 is disposed in the micro LED structure 120a.

In this embodiment, the supporting layer 140 may have a uniform thickness, therefore may be capable of evenly absorbing the wave generating by removing the growth substrate. Other details are similar to the embodiment of FIG. 2K, and therefore not repeated herein.

Figure 4:
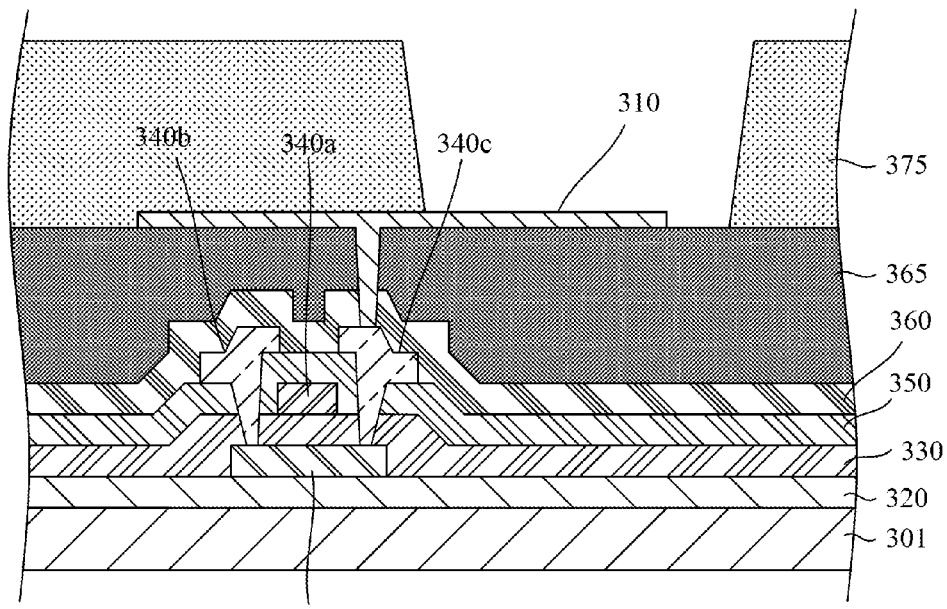
FIG. 4 is a cross-sectional views illustrating a receiving substrate according to an embodiment of the invention.

FIG. 4 is a cross-sectional view illustrating the receiving substrate 300 according to an embodiment of the invention. Referring to FIG. 4, a buffer layer 320 is formed on a substrate 301. A gate insulating layer 330 is formed on the entire surface of the substrate 301 having the semiconductor layer 325. A gate electrode 340a, an interlayer insulating layer 350, and source and drain electrodes 340b and 340c are formed on the gate insulating layer 330 to constitute a top gate structured thin film transistor (TFT). A passivation layer 360 and a planarization layer 365 are sequentially formed on or over an entire surface of the substrate 301, and a bonding electrode 310 is formed on the planarization layer 365 such that the bonding electrode 310 is electrically connected to the source or drain electrodes 340b and 340c by way of a via hole (not shown) formed through the passivation layer 360 and the planarization layer 365. A pixel defining layer 375 is then formed on or over the planarization layer 365 and/or a portion of the bonding electrode 310 to partially expose (or to expose a portion of) the bonding electrode 310.

Figure 5:
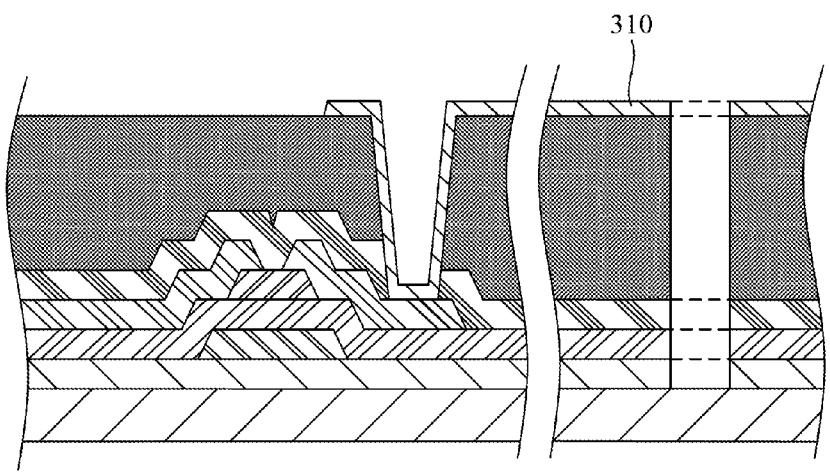
FIG. 5 is a cross-sectional view illustrating the receiving substrate according to another embodiment of the invention.

It is to be appreciated that the receiving substrate 300 with the top gate structured TFT illustrated in FIG. 4 is meant to be exemplary. FIG. 5 is a cross-sectional view illustrating the receiving substrate 300 according to another embodiment of the invention. Referring to FIG. 5, in the embodiment, the receiving substrate 300 is illustrated to include a bottom gate structured TFT, and photolithography is applied to fabricate the receiving substrate 300 as needed. In some embodiments, a variety of suitable TFTs of the receiving substrate 300 can be utilized in the invention.

Figure 6:
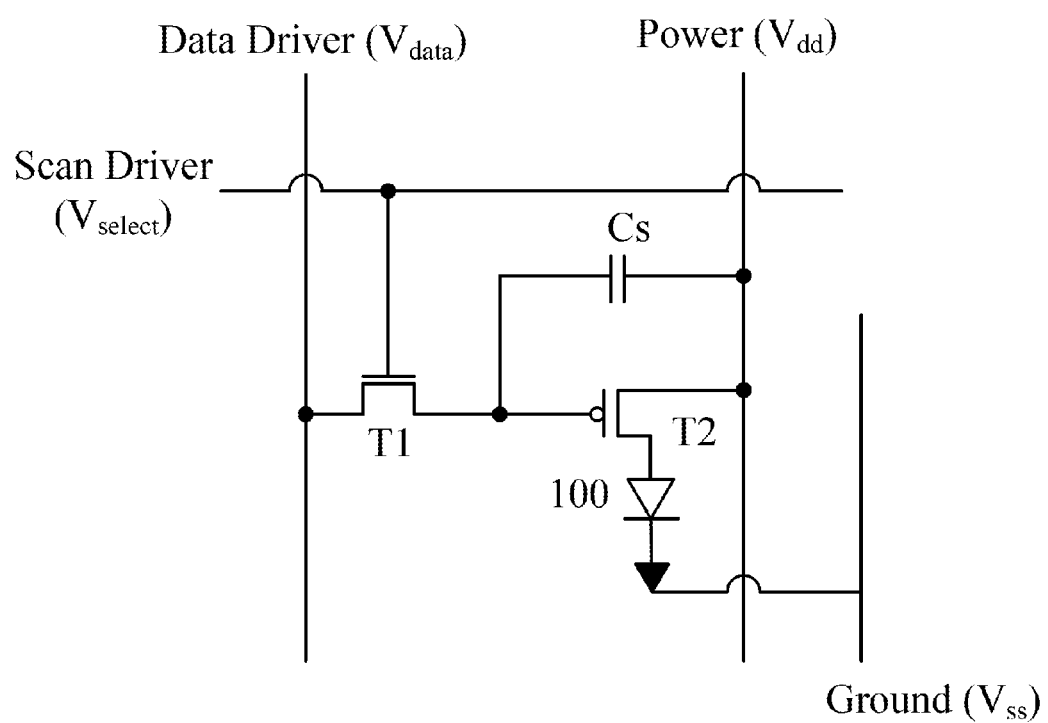
FIG. 6 is a circuit diagram of a subpixel with 2T1C circuitry in an active matrix display in accordance with an embodiment of the invention.

FIG. 6 is a circuit diagram of a subpixel with 2T1C circuitry according to an embodiment of the invention. In such an embodiment, the circuit can be used in the receiving substrate 300 illustrated in FIG. 4 or FIG. 5, which makes the receiving substrate 300 become an active matrix display substrate. The circuit includes a switching transistor T1, a driving transistor T2, a storage capacitor Cs, and a micro-LED 100. The transistors T1, T2 can be any type of transistor such as a thin film transistor. For example, the switching transistor T1 can be an n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro-LED 100 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro-LED 100 can emit light based on the current. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for electrical characteristic to the driver transistor and the micro device, or for their instabilities.

Figure 7:
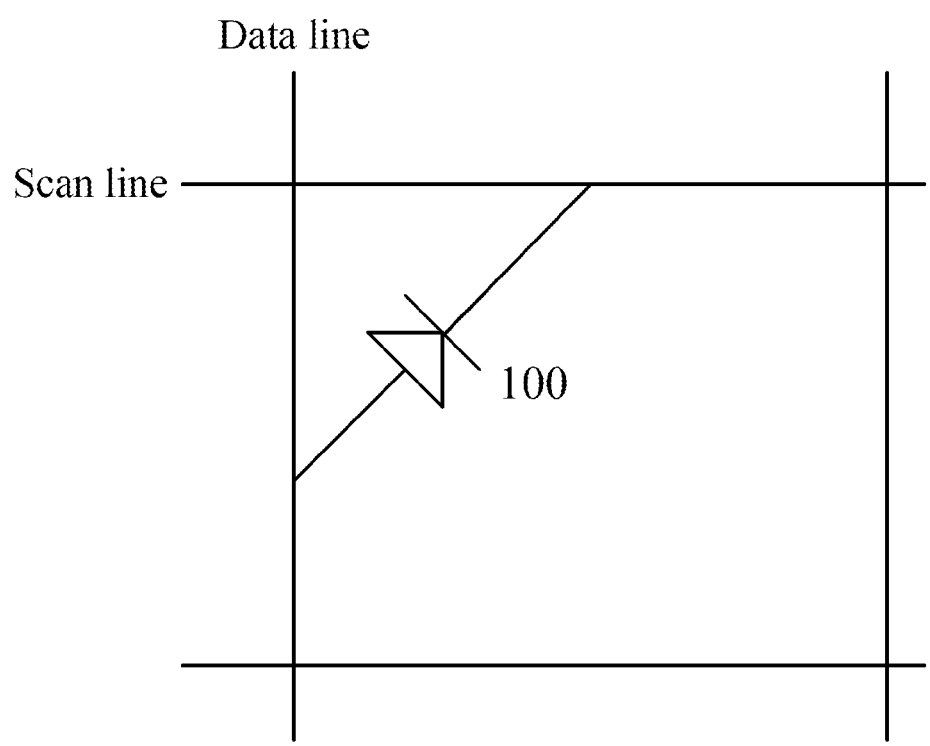
FIG. 7 is a circuit diagram of a subpixel according to an embodiment of the invention.

FIG. 7 is a circuit diagram of a subpixel according to an embodiment of the invention. In such an embodiment, the circuit used in the receiving substrate 300 makes the receiving substrate 300 become a passive matrix display substrate.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims is not intended to invoke the provisions of 35 U.S.C. § 112, 6th paragraph.

What is claimed is:

1. A method for manufacturing at least one light emitting diode (LED), the method comprising:
    epitaxially growing at least one light emitting diode (LED) structure on a growth substrate, wherein the LED structure has a top surface away from the growth substrate;
    forming at least one supporting layer on the LED structure, wherein the supporting layer is made of metal, alloy, or a transparent conductive material;
    providing a carrier substrate with an adhesive layer thereon;
    contacting the supporting layer to the adhesive layer to temporarily adhere the supporting layer to the carrier substrate through the adhesive layer, wherein the supporting layer has a Young's modulus greater than that of the adhesive layer, and a shortest distance between the adhesive layer and the growth substrate is greater than a shortest distance between the top surface of the LED structure and the growth substrate;
    removing the growth substrate from the LED structure, such that the LED structure fully covers and is joined with the supporting layer; and
    picking up at least a portion of the LED structure with at least a portion of the supporting layer from the adhesive layer, such that the adhesive layer is exposed and remains on the carrier substrate.

2. The method of claim 1, wherein the removing is performed by laser lift-off, a combination of the laser lift-off and chemical lift-off, or a combination of the laser lift-off and mechanical lift-off.

3. The method of claim 1, further comprising:
    absorbing at least one vibration wave created by the removing through the supporting layer.

4. The method of claim 1, wherein a plurality of the supporting layers are stacked together, wherein the supporting layers are made of the same or different materials.

5. The method of claim 1, wherein the supporting layer is reflective.

6. The method of claim 1, wherein the supporting layer has a thickness greater than or equal to 2 μm.

7. The method of claim 1, further comprising:
    chipping at least the LED structure into a plurality of micro-LED structures, wherein the picking up the portion of the LED structure comprises picking up one of the micro-LED structures.

8. The method of claim 7, wherein the chipping is performed before the removing.

9. The method of claim 7, wherein the chipping is performed after the removing.

10. The method of claim 7, wherein the chipping extends into the supporting layer;
    further comprising:
    reducing adhesion force of the adhesive layer to the chipped supporting layer while remaining the chipped supporting layer within a controllable position on the adhesive layer before the picking up said one of the micro-LED structures, wherein the picking up said one of the micro-LED structures comprises picking up the chipped supporting layer under said one of the micro-LED structures from the adhesive layer; and
    releasing said one of the micro-LED structures with the chipped supporting layer onto a receiving substrate after the adhesion force of the adhesive layer is reduced.

11. The method of claim 10, further comprising:
    forming a eutectic system, a soldering contact, or a transient liquid phase sintering system of the chipped supporting layer and an bonding electrode of the receiving substrate after said one of the micro-LED structures is released onto the receiving substrate.

12. The method of claim 10, wherein the adhesion force of the adhesive layer is reduced by an electric field, electromagnetic radiation, heat, ultrasound, mechanical force, pressure, chip lifting, or combinations thereof.

13. The method of claim 1, wherein the LED structure comprises:
    a first type semiconductor layer; and
    a second type semiconductor layer joined with the first type semiconductor layer.

14. The method of claim 13, wherein the LED structure comprises:
   at least one current controlling structure joined with one of the first type semiconductor layer and the second type semiconductor layer, the current controlling structure having at least one opening therein.

15. The method of claim 14, wherein the current controlling structure is a dielectric layer.

* * * * *